United States Patent [19]

Hatakeyama et al.

[11] Patent Number: 4,784,901
[45] Date of Patent: Nov. 15, 1988

[54] FLEXIBLE PRINTED CIRCUIT BOARD BASE MATERIAL

[75] Inventors: Minoru Hatakeyama, Sakuragaokanishi; Kosuke Moriya; Ichiro Komada, both of Okayama, all of Japan

[73] Assignee: Japan Gore-Tex, Inc., Tokyo, Japan

[21] Appl. No.: 37,412

[22] Filed: Apr. 13, 1987

[51] Int. Cl.[4] ............................................. B32B 17/10
[52] U.S. Cl. .................................. 428/268; 428/422; 428/473.5; 428/901
[58] Field of Search ............ 428/422, 901, 268, 473.5; 264/288.8; 427/96

[56] References Cited
U.S. PATENT DOCUMENTS 3,953,566  4/1976  Gore ............................... 428/422 X
4,456,712  6/1984  Christie et al. .................. 428/901 X
4,526,835  7/1985  Takahashi et al. .............. 428/901 X
4,576,861  3/1986  Kato ................................ 428/422 X
4,634,631  1/1987  Gazit et al. ..................... 428/422 X
4,640,866  2/1987  Suzuki ................................. 428/422
4,692,369  9/1987  Nomi ............................. 428/422 X
4,701,362  10/1987 Suzuki et al. .................... 428/422 X Primary Examiner—Thomas J. Herbert
Attorney, Agent, or Firm—Mortenson & Uebler

[57] ABSTRACT

A flexible base material for use in printed circuit boards is provided wherein a sheet of porous, expanded polytetrafluoroethylene is impregnated with a bismaleimide-triazine resin, and the resin is cured therein. The sheet may be laminated to a glass cloth and composites may be produced having a multiplicity of layers of such sheets and glass cloths.

3 Claims, 2 Drawing Sheets

FLEXIBLE PRINTED CIRCUIT BOARD BASE MATERIAL

BACKGROUND OF THE INVENTION

This invention relates to a flexible printed circuit base material, and provides a printed circuit board material which has a low dielectric constant and also is flexible.

Providing flexibility to materials used for printed circuit boards results in enhancement of the freedom of design of such systems because printed circuit boards made of a flexible material can be installed in limited spaces, particularly in bent gaps, for example, and can be installed in places having varied shapes. In recent years, because achievements serving to reduce wall thicknesses and overall dimensions of electronic devices are profoundly important, flexible materials have been finding utility in a growing range of applications.

Heretofore, polyimide resin and polyester resin have been used as flexible materials for printed circuit boards. In recent years, such super-high speed elements as gallium arsenide IC's have been developed. To permit manufacture of devices of high operating speed by the use of such elements, the materials used for the production of their printed circuit boards are required to have low dielectric constants. To meet this requirement, a material made of bismaleimide-triazine resin has found utility in printed circuit boards.

Polyimide resin and polyester resin for printed circuit board applications have fairly large dielectric constants, falling on the order of 3.5 to 4.0 (at 1 MHz) and are generally not capable of meeting the aforementioned requirements, resulting in a need for development of devices having high operating speed for use in such super-high-speed elements mentioned above.

The material using the aforementioned bismaleimide-triazine resin has a low dielectric constant and, therefore, is capable of meeting the requirement directed to the development of devices having high operating speed. This resin heretofore generally could be used only as a rigid material. It cannot be molded easily in the shape of a thin film. Since it cannot easily assume flexibility, the needed material having high freedom of design mentioned above cannot be obtained from this resin alone.

SUMMARY OF THE INVENTION

A flexible printed circuit board base material is provided comprising a composite of an expanded, porous PTFE base sheet having cured bismaleimide-triazine resin impregnated within the pores of the base sheet. This base material may be laminated to a glass cloth or a glass cloth may be laminated between two sheets of the material. The amount of the bismaleimide-triazine resin contained within the pores of the base sheet is preferably in the range of 30% to 60% by weight, based on the total weight of the composite.

DETAILED DESCRIPTION OF THE INVENTION AND PREFERRED EMBODIMENTS WITH REFERENCE TO THE DRAWINGS

A flexible base material for use in printed circuit boards is provided wherein a sheet of porous, expanded polytetrafluoroethylene is impregnated with a bismaleimide-triazine resin, and the resin is cured therein. The sheet may be laminated to a glass cloth and composites may be produced having a multiplicity of layers of such sheets and glass cloths.

The bismaleimide-triazine resin and the polytetrafluoroethylene sheets used in the invention both have low dielectric constants. The composite produced by having the latter resin impregnated with the former resin possesses a sufficiently low dielectric constant and permits production of a material for printed circuits adapted for high-speed transmission of signals.

The porous membrane is obtained as disclosed in U.S. Pat. No. 3,953,566 by molding the polytetrafluoroethylene resin by rolling and stretching. The material possesses a fibrillated microstructure and exhibits notably high strength. The bismaleimide-triazine resin has its inherent rigidity moderated and the porous membrane of polytetrafluoroethylene resin has its softness suitably repressed by the fact that the former resin permeates the fibrillated microstructure and cures itself in situ. The resultant composite, therefore, has shape-retaining characteristics and flexibility suitable as the material for printed circuit boards.

BRIEF DESCRIPTION OF THE DRAWINGS

Figure 1:
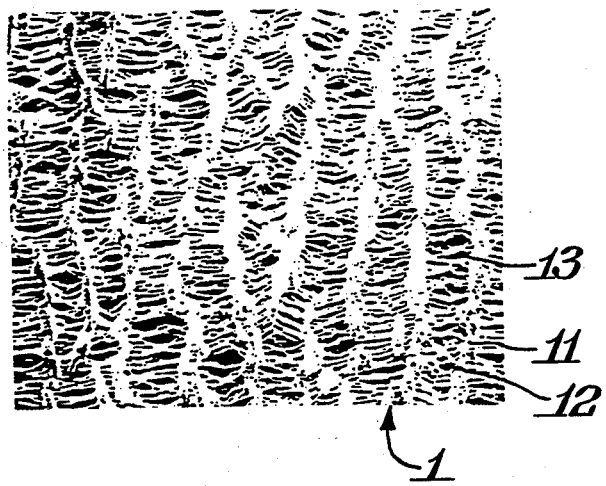
FIG. 1 and FIG. 2 are photomicrographs of the expanded, porous polytetrafluoroethylene membranes in accordance with the present invention.
Figure 2:
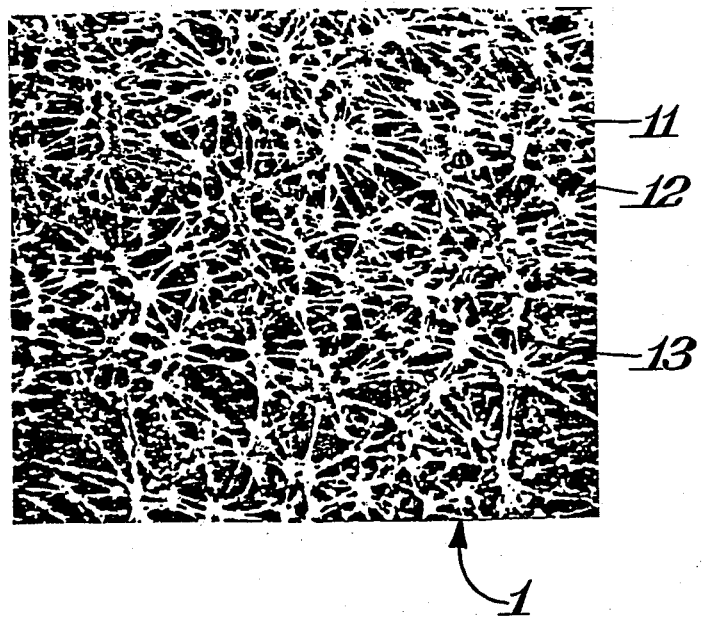
Figure 3:
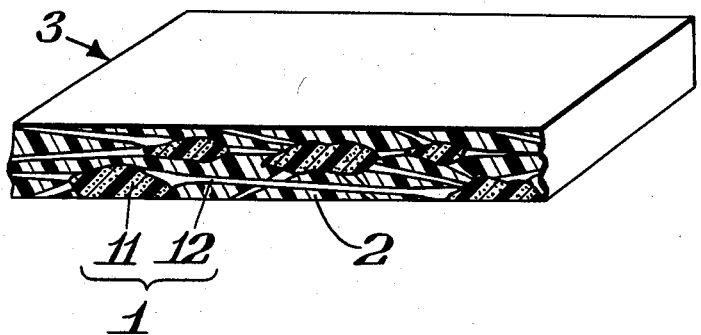
FIG. 3 is a perspective cross-sectional view of the printed circuit board base material according to the present invention.
Figure 4:
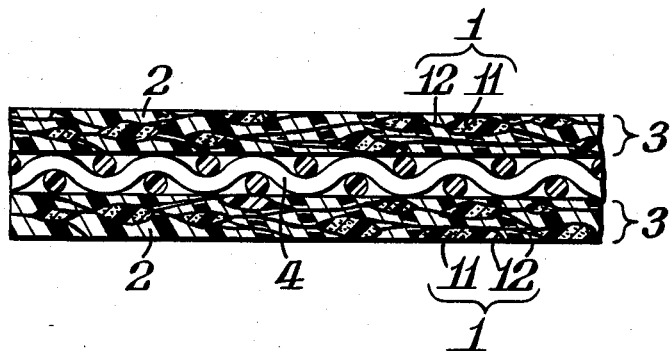
FIG. 4 shows two sheets of the material of the present invention bonded to a glass cloth.

The drawings illustrate embodiments of the present invention. FIG. 1 and FIG. 2 are photomicrographs showing fibrous forms of porous, expanded polytetrafluoroethylene membranes obtained in accordance with the present invention. FIG. 3 is a cross-section showing a construction according with the present invention. FIG. 4 shows sheets according to the invention bonded to a glass cloth.

In the drawings, 1 denotes a porous, expanded polytetrafluoroethylene material, 2 the bismaleimide-resin, 11 denotes minute nodes, 12 denotes minute fibers, 13 indicates voids and 4 is a glass cloth.

This invention uses the aforementioned bismaleimide-triazine resin to take advantage of the low dielectric constant characteristic of this resin. It uses this bismaleimide-triazine resin in combination with the polytetrafluoroethylene resin, with the polytetrafluoroethylene resin adopted in the form of a porous membrane. Specifically, this polytetrafluoroethylene resin is fibrillated by the techniques of rolling and stretching. As noted from typical examples of photomicrographs of this material illustrated in FIG. 1 and FIG. 2, countless minute nodes 11, fibrils 12 and voids 13 formed therebetween complete the structure which has a porosity ranging from 50 to 95%.

When the aforementioned bismaleimide-triazine resin 2 is caused to permeate the porous fibrillated texture of the porous, expanded polytetrafluoroethylene material 1 as illustrated in FIGS. 1 and 2 and cured in situ, the bismaleimide-triazine resin effectively enters the microstructure of the aforementioned minute fibers 12 and entangles and binds itself with the minute fibers as illustrated in FIG. 3 to give rise to an integral sheet-like material.

The minute fibers 12 which are fibrillated as described above possess sufficient tensile strength and the porous, expanded polytetrafluoroethylene material 1, which is an aggregate of such minute fibers 12 and minute nodes 11, possesses sufficient softness. The aforementioned bismaleimide-triazine resin which is impregnated within the soft porous texture is enabled by the porous texture mentioned above to assume desired flexibility as a consequence of moderation of its inherent rigidity. The porous material 1 mentioned above is formed of a thin film of thickness as low as 0.25 to 0.5 mm, for example. When this porous film is impregnated with the bismaleimide-triazine resin 2, the material for a printed circuit board consequently obtained has a thickness on the order of 0.015 to 0.3 mm. It is possible to superpose a plurality of the porous sheets to produce a thick film having a desired thickness in the range of 0.15 to 1.0 mm and still retain the desired flexibility. It is possible to laminate two or more such sheets to a glass cloth as depicted in FIG. 4.

The amount of the bismaleimide-triazine resin 2 to be contained by impregnation in the final product generally falls in the range of 30 to 60% by weight. Since the polytetrafluoroethylene resin has a small dielectric constant as the resin 2, a slight deviation of the content of the bismaleimide-triazine resin from the aforementioned range permits suitable selection of the flexibility of the material for the printed circuit board without adversely affecting the speed of signal transfer of the material.

When the aforementioned bismaleimide-triazine resin 2 is caused to permeate the porous fibrillated texture of the porous, expanded polytetrafluoroethylene material 1 as illustrated in FIGS. 1 and 2 and cured in situ, the bismaleimide-triazine resin, which is a material having a low dielectric constant, effectively enters the microstructure of the aforementioned minute fibers 12 and engages and binds itself with the minute fibers to give rise to an integral sheet-like material.

The aforementioned porous material 1 is generally formed in the form of a thin film having a thickness in the range of 0.005 to 1.0 mm, preferably 0.01 to 0.3 to mm. The composite obtained by impregnating this porous material with the bismaleimide-triazine resin 2 is a thin component material 3 which has a thickness generally in the range of 0.005 to 1.0 mm, preferably in the range of 0.1 to 0.3 mm.

Glass cloths 4 can be alternately superposed on such component materials and joined to one another by adhesion as shown in FIG. 4. To be specific, an integrated product can be obtained by causing the glass cloths 4 to polymerize and solidify while the aforementioned component materials 3, resulting from the aforementioned impregnation with the bismaleimide-triazine resin, are left in their uncured state. The glass cloths 4 may be impregnated with the bismaleimide-triazine resin in advance and subsequently polymerized and solidified for integration. The superposition and the polymerization described above may be accomplished by having at least two component materials 3 superposed one each on the front and rear sides of the glass cloth 4 as illustrated in FIG. 4 or by having the aforementioned two layers 3, 4 alternately superposed several times to tens of times. The component material 3 is allowed to acquire properties which harmoniously combine the flexibility of the porous film of polytetrafluoroethylene resin with the rigidity of the bismaleimide-triazine resin. The produce having an electroconductive layer formed therein with a copper foil, for example, acquires stability of size or shape by the combination of the strength of the glass cloth 4 and the strength resulting from the union of the glass cloth 4 and the component material 3. Thus, the product can be utilized stably even under changing temperature conditions.

EXAMPLE 1

A porous, expanded polytetrafluoroethylene membrane having a thickness of 50 micrometers and containing pores of an average diameter of 0.4 micrometers and a void ratio of 75%, produced by rolling and stretching, was impregnated with 40% by volume, based on the porous, expanded polytetrafluoroethylene membrane, of bismaleimide-triazine resin and then left aging to cure the resin, to produce a material 25 micrometers in thickness. This material was found by measurement to have a very low dielectric constant of 2.5. When it was bent with a radius of curvature of 4.8 mm, it sustained neither a crack nor a break. It was thus confirmed to make a material of satisfactory flexibility for printed circuit boards according to the invention.

As described herein, the material obtained by this invention has an exceptionally low dielectric constant falling on the order of 2.3 to 3.2, permits formation of circuits of notably increased signal transfer speed in combination with super-high-speed elements of recent development, possesses satisfactory flexibility and enables itself to be incorporated in any desired shape into internal spaces of devices, improving freedom of design and ensures desirable reductions in size and weight of the devices. Thus, this invention will enjoy high economic value and performance.

EXAMPLE 2

A prepreg was produced by impregnating a porous, stretched film of polytetrafluoroethylene having a porosity of 80% and a thickness of 0.08 mm with a mixed solution of MEK and DMF of bismaleimide-triazine resin (resin component 60 wt %) and subsequently removing the solvent. The bismaleimide-triazine resin content in this prepreg was about 60%. Two sheets of the prepreg were superposed one each on the opposite sides of a glass cloth 0.05 mm in thickness and hot pressed until solidification and integration, to produce a product having a cross-sectional structure illustrated in FIG. 4.

EXAMPLE 3

Prepregs 3 prepared by following the procedure of Example 2 and glass cloths 4 having a thickness of 0.05 mm were alternately superposed to produce a total of 21 layers and then hot pressed until solidification and integration to provide a product.

The products obtained in Examples 2 and 3 as described above were tested for electrical characteristics. It was found that they both had a dielectric loss tangent of 0.002 and a volume resistivity of $1 \times 10^{16}$—Ohm—cm. The dielectric constant was 2.5 for the product of Example 2 and 2.7 for the product of Example 3, which were both very low values. When these products were converted into printed circuit boards by deposition of a copper foil, they neither curled nor bent, even when they were exposed to temperature changes betwee $-20°$ to $140°$ C.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A flexible printed circuit board base material comprising a composite of an expanded, porous PTFE base sheet having cured bismaleimide-triazine resin impregnated within the pores of the base sheet, wherein said base material is laminated to a glass cloth.

2. The printed circuit board base material of claim 1 wherein a glass cloth is laminated between two sheets of said material.

3. The printed circuit board base material of claim 1 wherein the amount of the bismaleimide-triazine resin contained within said pores of said base sheet is in the range of 30% to 60% by weight, based on the total weight of said composite.

* * * * *